United States Patent
Hwang

(10) Patent No.: US 7,934,632 B2
(45) Date of Patent: May 3, 2011

(54) APPARATUS FOR MANUFACTURING SEMICONDUCTOR PACKAGE FOR WIDE LEAD FRAME AND METHOD OF CONSTRUCTING SEMICONDUCTOR PACKAGE USING THE SAME

(75) Inventor: Sun Ha Hwang, Chungcheongnam-Do (KR)

(73) Assignee: STS Semiconductor & Telecommunications Co., Ltd., Chungcheongnam-Do (KR)

( * ) Notice: Subject to any disclaimer, the term of this patent is extended or adjusted under 35 U.S.C. 154(b) by 0 days.

(21) Appl. No.: 12/393,651

(22) Filed: Feb. 26, 2009

(65) Prior Publication Data
US 2009/0269889 A1    Oct. 29, 2009

(30) Foreign Application Priority Data
Apr. 25, 2008  (KR) .................. 10-2008-0038989

(51) Int. Cl.
*B23K 37/00* (2006.01)
(52) U.S. Cl. .............. 228/4.5; 228/180.21; 228/180.5; 257/E21.499; 438/123
(58) Field of Classification Search .............. 228/47.1, 228/4.5, 110.1, 1.1, 43, 49.5, 180.21, 180.5; 257/E21.499; 438/123, 111, 121
See application file for complete search history.

(56) References Cited

U.S. PATENT DOCUMENTS

| | | | | |
|---|---|---|---|---|
| 4,854,494 A | * | 8/1989 | von Raben | 228/102 |
| 5,238,174 A | * | 8/1993 | Ricketson et al. | 228/180.21 |
| 5,465,899 A | * | 11/1995 | Quick et al. | 228/180.5 |
| 5,566,876 A | * | 10/1996 | Nishimaki et al. | 228/102 |
| 5,979,739 A | * | 11/1999 | Jin et al. | 228/6.2 |
| 6,705,001 B2 | * | 3/2004 | How et al. | 29/783 |
| 6,827,247 B1 | * | 12/2004 | Fan et al. | 228/1.1 |
| 7,568,606 B2 | * | 8/2009 | Wong et al. | 228/43 |
| 2005/0006743 A1 | | 1/2005 | Kim et al. | |
| 2009/0269887 A1 | * | 10/2009 | Hwang | 438/121 |

FOREIGN PATENT DOCUMENTS

| | | |
|---|---|---|
| JP | 05-013517 | 1/1993 |
| JP | 2001-127082 | 5/2001 |
| JP | 2002-164361 | 6/2002 |
| KR | 10-0208481 | 4/1999 |
| KR | 100208481 | 4/1999 |

OTHER PUBLICATIONS

English language translation of First Office Action regarding Chinese Patent Application No. 200910132099.X dated Apr. 26, 2010.
English language translation of First Office Action regarding Chinese Patent Application No. 200910132098.5 dated Apr. 23, 2010.

* cited by examiner

*Primary Examiner* — Roy King
*Assistant Examiner* — Michael Aboagye
(74) *Attorney, Agent, or Firm* — Greenlee Sullivan P.C.

(57) ABSTRACT

An apparatus for manufacturing a semiconductor package includes an index rail transferring a lead frame in forward and backward directions, the lead frame having a first surface and a second surface that is opposite to the first surface, a loader portion connected to an end portion of the index rail and supplying the lead frame to the index rail, a frame driving portion connected to the opposite end portion of the end portion of the index rail and rotating the lead frame around a normal to the first surface, and a wire bonding portion electrically connecting the lead frame and a semiconductor chip attached to the lead frame supplied to the index rail using a wire bond.

15 Claims, 9 Drawing Sheets

APPARATUS FOR MANUFACTURING SEMICONDUCTOR PACKAGE FOR WIDE LEAD FRAME AND METHOD OF CONSTRUCTING SEMICONDUCTOR PACKAGE USING THE SAME

CROSS-REFERENCE TO RELATED PATENT APPLICATIONS

This application claims the benefit of Korean Patent Application No. 10-2008-0038989, filed on Apr. 25, 2008, in the Korean Intellectual Property Office, the disclosure of which is incorporated herein in its entirety by reference.

BACKGROUND OF THE INVENTION

1. Field of the Invention

The present invention relates to an apparatus for and method of manufacturing a semiconductor package, and more particularly, to an apparatus for and method of constructing a semiconductor package by performing a wire bonding process with respect to a wide lead frame.

2. Description of the Related Art

As use of mobile phones and laptops has constantly increased, such electronic apparatuses have been developed to be more compact, lighter, and have more functions. Accordingly, electronic parts used for use in these electronic apparatuses need to be made smaller and with higher integration density. To meet the needs, along with a method of highly integrating a semiconductor chip to decrease its size, a method of mounting a semiconductor chip using a multi-chip packaging technology has been widely used.

FIG. 1 is a cross-sectional view illustrating the structure of a conventional dual die package (DDP). Referring to FIG. 1, two semiconductor chips, that is, first and second semiconductor chips 11 and 13, are mounted on a lead frame 20. The lead frame 20 includes a die pad 21 and a lead finger 23. The first and second semiconductor chips 11 and 13 are respectively attached to the upper and lower surfaces of the die pad 21 via first and second adhesive layers 25 and 26. The first and second semiconductor chips 11 and 13 are electrically connected to the lead finger 23 via wire bonds 27 and 28. The first and second semiconductor chips 11 and 13, the wire bonds 27 and 28, and their junction portions are sealed by a molding resin 15 such as epoxy molding compound so as to be protected from an external environment.

FIG. 2 is a cross-sectional view illustrating the structure of a conventional quad die package (QDP). Referring to FIG. 2, four semiconductor chips are mounted on a lead frame 40 including a die pad 41 and a lead finger 43. That is, first and second semiconductor chips 31 and 33 are sequentially deposited on the upper surface of the die pad 41 by being attached to first and second adhesive layers 45 and 47. Third and fourth semiconductor chips 35 and 37 are sequentially deposited on the lower surface of the die pad 41 by being attached to third and fourth adhesive layers 46 and 48. The first through fourth semiconductor chips 31, 33, 35, and 37 are electrically connected to the lead finger 43 via wire bonds 51, 53, 55, and 57. The first through fourth semiconductor chips 31, 33, 35, and 37, the wire bonds 51, 53, 55, and 57, and their junction portions are sealed by a molding resin 61 such as epoxy molding resin.

The process of manufacturing a single semiconductor chip package and a semiconductor package using a lead frame in the DDP and QDP structures shown in FIGS. 1 and 2, includes a wire bonding process for separating a unit semiconductor chip from a wafer where integrated circuits (ICs) are formed and attaching the separated unit semiconductor chip to a lead frame, a wire bonding process for bonding the semiconductor chip and the lead frame using a conductive metal wire so as to be electrically connected therebetween, a molding process for molding the electrically connected parts with molding resin to protect them from an external environment, a trim/form process for cutting and bending the lead finger that protrudes outside, and a test process for testing reliability of a complete IC chip package.

In the conventional semiconductor package manufacturing process, the lead frame is used for providing a place for mounting a semiconductor chip and as a means for an electrical connection. In this regard, as the competition in the market and development of semiconductor device technology has increased, productivity and cost reduction become more important issues. Conventionally, the lead frame is manufactured in a strip shape so that eight to ten semiconductor packages can be simultaneously manufactured. However, in order to increase the number of the semiconductor packages to be manufactured using a single lead frame, a wide lead frame having a wide width has been developed so that a number of semiconductor packages can be manufactured not only in the lengthwise direction of the lead frame but also in the widthwise direction of the lead frame.

However, in order to use the wide lead frame, a semiconductor package manufacturing equipment is necessary and the costs for developing and manufacturing such the equipment is high. Furthermore, the semiconductor chip package manufacturing process for multi-chip packaging requires a manual work so that a process time increases due to a process delay, and accordingly productivity, deteriorates.

SUMMARY OF THE INVENTION

To solve the above and/or other problems, the present invention provides an apparatus for manufacturing a semiconductor chip package using a wide lead frame.

Also, the present invention provides a method of constructing a semiconductor chip package using a wide lead frame so that the manufacturing cost is reduced and productivity is improved.

According to an aspect of the present invention, an apparatus for manufacturing a semiconductor package comprises an index rail transferring a lead frame in forward and backward directions, the lead frame having a first surface and a second surface that is opposite to the first surface, a loader portion connected to an end portion of the index rail and supplying the lead frame to the index rail, a frame driving portion connected to the opposite end portion of the end portion of the index rail and rotating the lead frame around a normal to the first surface, and a wire bonding portion electrically connecting the lead frame and a semiconductor chip attached to the lead frame supplied to the index rail using a wire bond.

The wire bonding portion comprises a bonding head having a bonding transducer connecting the lead frame and the semiconductor chip attached to the lead frame using a conductive wire, and a transfer module transferring the bonding head over the index rail.

The transfer module moves the bonding head in a widthwise direction of the index rail from one end of the index rail in the widthwise direction at least to the center position of the width of the index rail.

The apparatus further comprises an unloading portion connected to the frame driving portion to exhaust the lead frame to the outside of the apparatus, wherein the frame driving portion selectively transfers the lead frame to the unloading portion or supplies the lead frame back to the index rail according to the state of the lead frame.

To rotate the lead frame around a normal to the first surface, the frame driving portion comprises a frame loading rail supporting the lead frame, a rotary table supporting the frame loading rail, a rotational shaft connected to the rotary table in a direction along the normal to the first surface, and a rotation driving apparatus supplying a rotation driving force to the rotation shaft.

The frame loading rail supports the lead frame so that the frame driving portion rotates the lead frame one for each time.

The frame driving portion rotate the lead frame by 180°.

The loader portion has an unloading function to exhaust the lead frame transferred from the index rail to the outside of the apparatus.

The frame driving portion further comprises a reversing apparatus which reverses the lead frame so that one surface facing upward from the first and second surfaces of the lead frame faces downward.

According to another aspect of the present invention, an apparatus for manufacturing a semiconductor package comprises a first wire bonding apparatus and a second wire bonding apparatus, each comprising an index rail transferring a lead frame having a first surface and a second surface that is opposite to the first surface in forward and backward directions and a wire bonding portion electrically connecting the lead frame and a semiconductor chip attached to the lead frame, using a wire bond, a loader portion connected to an end portion of the first wire bonding apparatus and supplying the lead frame to the first wire bonding apparatus, an unloader portion connected to an end portion of the second wire bonding apparatus and exhausting the lead frame from the second wire bonding apparatus, and a frame driving portion connected between the opposite end portions of the end portions of the first and second wire bonding apparatuses and rotating the lead frame around a normal to the first surface.

The frame driving portion selectively transfers the lead frame to the first wire bonding apparatus or the second wire bonding apparatus according to the state of the lead frame.

According to another aspect of the present invention, a method of manufacturing a semiconductor package comprises supplying a lead frame having a first surface, on which a plurality of semiconductor chips is attached and a second surface opposite to the first surface, with the first surface facing upward, to a wire bonding portion, wherein the lead frame is moved in a first direction, electrically connecting the lead frame and some of the semiconductor chips attached to the first surface of the lead frame, in the wire bonding portion (a first wire bonding operation), rotating the lead frame around a normal to the first surface, and electrically connecting the lead frame and the semiconductor chips attached to the first surface of the lead frame, but not wire bonded, in the wire bonding portion (a second wire bonding operation).

The method further comprises reversing the lead frame so that the second surface of the lead frame faces upward, wherein a plurality of semiconductor chips are attached on the second surface, electrically connecting the lead frame and some of the semiconductor chips attached to the second surface of the lead frame, in the wire bonding portion (a third wire bonding operation), rotating the lead frame around a normal to the second surface, and electrically connecting the lead frame and the semiconductor chips attached to the first surface of the lead frame, but not wire bonded, in the wire bonding portion (a fourth wire bonding operation).

In the first wire bonding operation, the lead frame and all of the semiconductor chips attached at least in a half portion of the first surface of the lead frame with respect to a centerline of the first surface extending in the first direction are electrically connected using a wire bond. In the second wire bonding operation, the lead frame and all of the semiconductor chips attached at least in a half portion of the first surface of the lead frame with respect to a centerline of the first surface extending in the first direction are electrically connected using a wire bond.

In the third wire bonding operation, the lead frame and all of the semiconductor chips attached at least in a half portion of the second surface of the lead frame with respect to a centerline of the second surface extending in the first direction are electrically connected using a wire bond. In the fourth wire bonding operation, the lead frame and all of the semiconductor chips attached at least in a half portion of the second surface of the lead frame with respect to a centerline of the second surface extending in the first direction are electrically connected using a wire bond.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
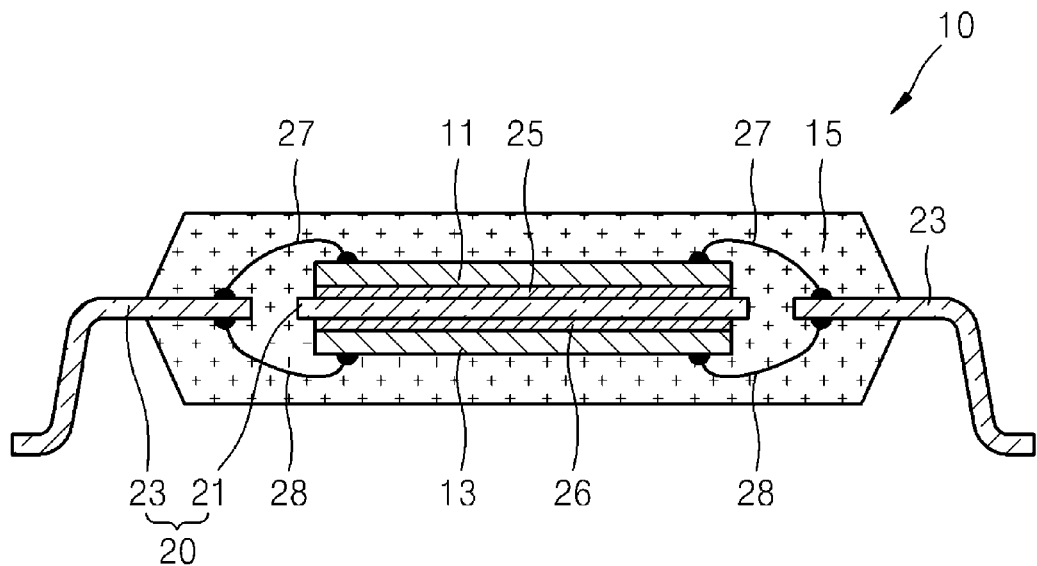
FIG. 1 is a cross-sectional view illustrating the structure of a conventional dual die package (DDP)
Figure 2:
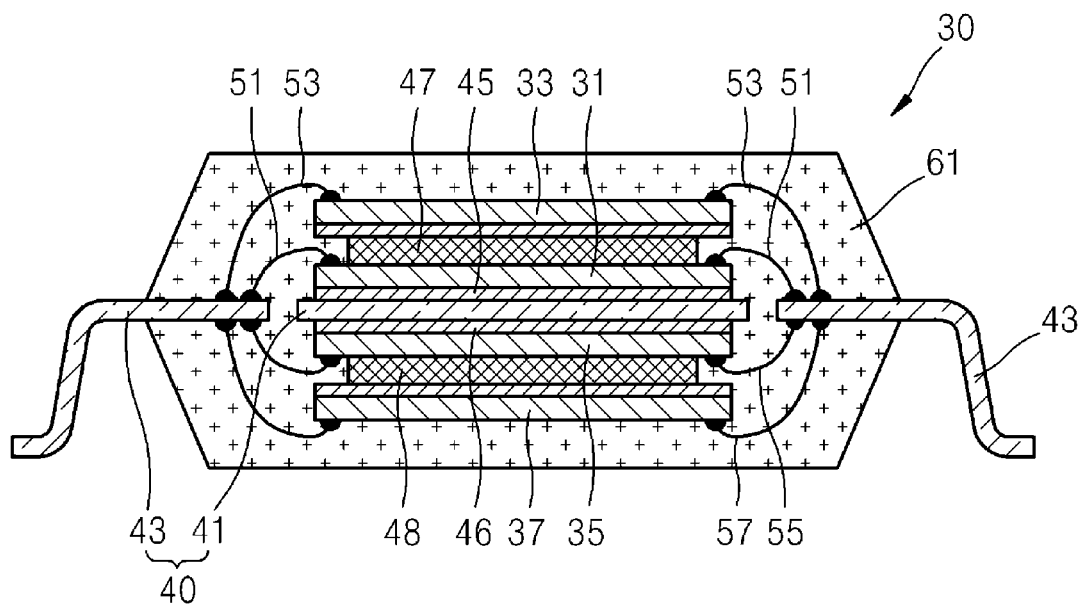
FIG. 2 is a cross-sectional view illustrating the structure of a conventional quad die package (QDP)

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements. The terms used herein are merely for the purpose of explanation of the present invention, not for limiting the meaning or scope of the present invention defined in the attached claims.

Figure 3:
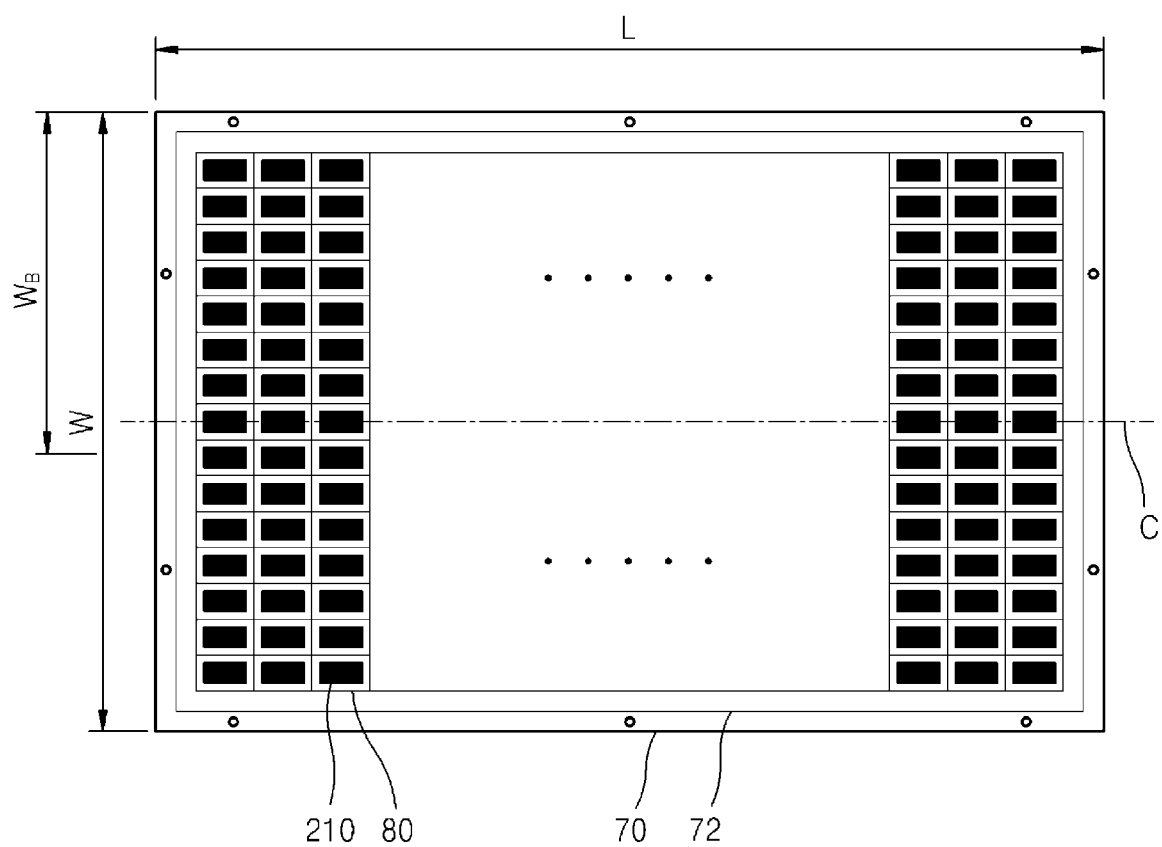
FIG. 3 is a plan view of a wide lead frame for manufacturing a semiconductor package according to an embodiment of the present invention.

FIG. 3 is a plan view of a wide lead frame 70 for manufacturing a semiconductor package according to an embodiment of the present invention. Referring to FIG. 3, a plurality of unit lead frames 80 are repeatedly arranged on the wide lead frame 70 in both of a lengthwise direction L and a widthwise direction W of the wide lead frame 70. The lengthwise direction L of the wide lead frame 70 means a direction in which the wide lead frame 70 moves in a wire bonding process. A semiconductor chip 210 is attached to each of the unit lead frames 80. The wide lead frame 70 to manufacture a plurality of semiconductor packages undergoes the processes of electrical connection with the semiconductor chip 210 and the process of depositing a molding resin on a molding area 72. Then, the wide lead frame 70 is separated into individual semiconductor packages, thereby manufacturing a plurality of semiconductor packages. Accordingly, as the wide lead frame 70 includes more number of the unit lead frames 80, the size of the edge portion of the wide lead frame 70 that will be lost decreases so that the manufacturing cost is reduced and productivity is improved.

As it will be described in detail later, to electrically connect the wide lead frame 70 and the semiconductor chip 210, a conductive wire (not shown) is moved toward the wide lead frame 70 by a bonding head (not shown). In general, the wide lead frame 70 moves along an index rail (not shown) in the lengthwise direction L. Although the bonding head moves in the lengthwise direction L of the wide lead frame 70, the bonding head usually moves in the widthwise direction W of the wide lead frame 70 to wire bond the wide lead frame 70 and the semiconductor chip 210. A width centerline C of the wide lead frame 70 is an imaginary line connecting the center of the wide lead frame 70 in the widthwise direction W, and extending in the lengthwise direction L.

Since the wire bonding process must be accurately performed, the bonding head motion for moving the semiconductor chip should be very precise. The distance that the bonding head can move on the wide lead frame 70 placed on the index rail 120 and perform the wire bonding process with required precision is referred to as an effective movement distance. Accordingly, when the width W of the wide lead frame 70 is greater than an effective movement distance $W_B$ of the bonding head in the widthwise direction W, it is not possible to perform the wire bonding process to the semiconductor chip 210 on the wide lead frame 70 with the above required precision. The above required precision is determined according to the type and specification of the attached semiconductor chip or the wide lead frame 70 or the attached semiconductor chip. When the above required precision is not met, the possibility of a complete semiconductor package to be defective is high.

When a semiconductor package manufacturing apparatus having an increased effective movement distance of the bonding head is manufactured, excessive costs are needed. This is because a huge amount of cost is needed to develop and manufacture a precisely controlled equipment which can move a longer distance with high accuracy. Thus, a relatively higher cost is needed compared to the effects of the cost reduction and productivity improvement.

Figure 4:
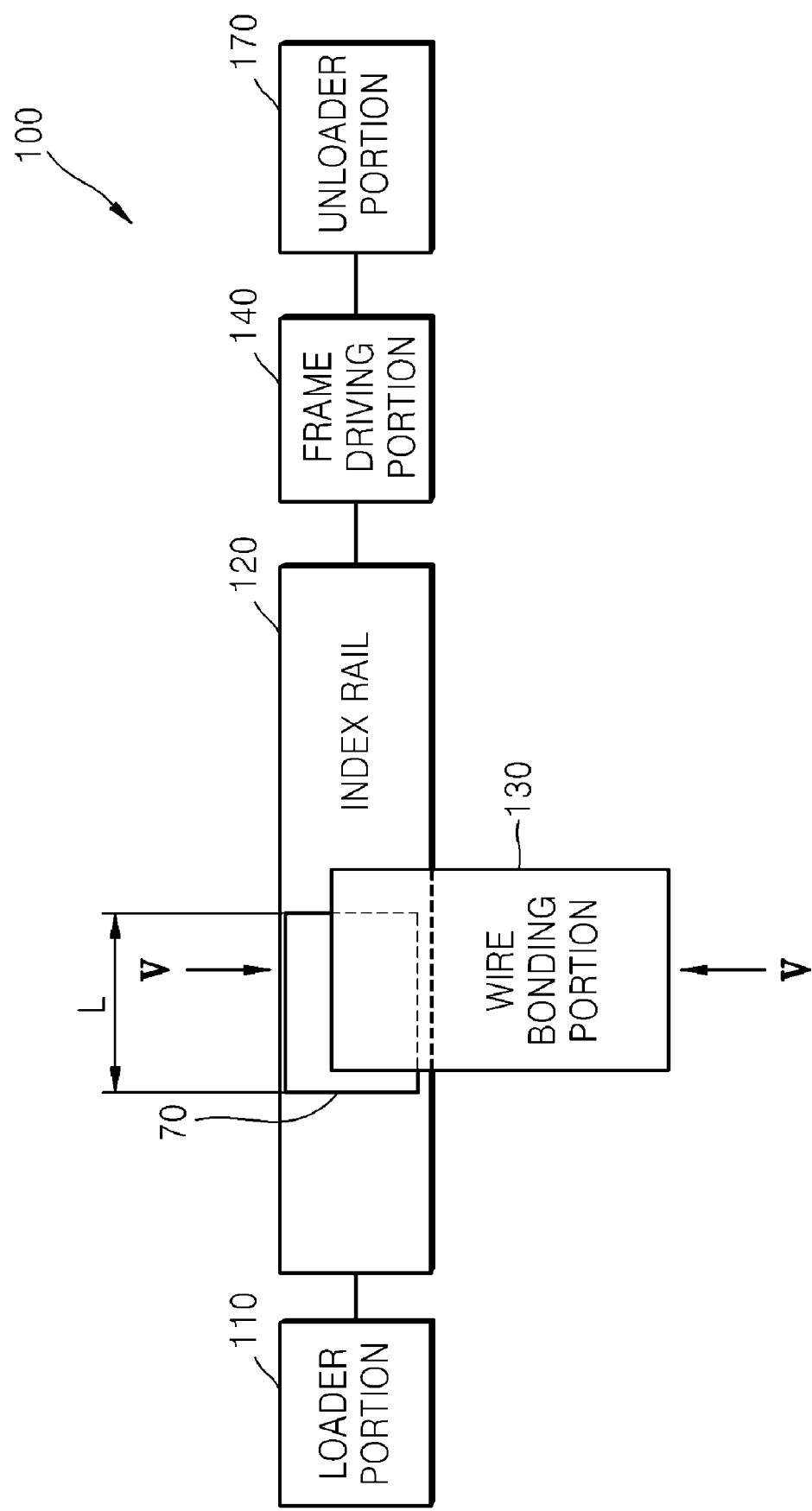
FIGS. 4 and 5 are, respectively, a plan view and a cross-sectional view of an apparatus for manufacturing a semiconductor package according to an embodiment of the present invention.

FIG. 4 is a plan view of an apparatus 100 for manufacturing a semiconductor package according to an embodiment of the present invention. Referring to FIG. 4, the apparatus 100 for manufacturing a semiconductor package includes a loader portion 110, an index rail 120, a wire bonding portion 130, and a frame driving portion 140. The loader portion 110 supplies the wide lead frame 70 contained in a magazine for containing a plurality of lead frames. The index rail 120 transfers the wide lead frame 70 supplied by the loader portion 110 to the frame driving portion 140. Therefore the wide lead frame 70 is moved in a lengthwise direction L. The wire bonding portion 130 wire bonds the wide lead frame 70 and the semiconductor chip 210 attached to the wide lead frame 70 transferred along the index rail 120 using a conductive wire, for example, a gold wire, so as to be electrically connected the wide lead frame 70 and the semiconductor chip 210.

The semiconductor chip attached to the wide lead frame 70 by the wire bonding portion 130 may be supplied by a wafer cassette loader portion 160 and a wafer table 150. A wafer having a plurality of semiconductor chips supplied by the wafer cassette loader portion 160 is placed on the wafer table 150. The wafer may be already separated into individual semiconductor chips when placed on the wafer table 150, or may be separated into individual semiconductor chips on the wafer table 150 after placed on the wafer table 150. That is, after an adhesive tape is attached to the rear surface of the wafer, the wafer may be placed on the wafer table 150 by being completely separated into individual semiconductor chips or by forming a groove between the individual semiconductor chips. Alternatively, after the wafer is placed on the wafer table 150 with the adhesive tape attached to the rear surface of the wafer, the semiconductor chips may be completely separated into individual semiconductor chips or a groove may be formed between the individual semiconductor chips. The interval between the individual semiconductor chips may be increased by expanding the adhesive tape. Also, vacuum pressure may be supplied to the wafer table 150 to detach the individual semiconductor chips from the adhesive tape.

The frame driving portion 140 may rotate the wide lead frame 70 transferred along the index rail 120 around a perpendicular line with respect to the upper or lower surface of the wide lead frame 70, or flip the wide lead frame 70 so that the upper surface of the wide lead frame 70 can face down. The frame driving portion 10 may have both of the rotating and flipping functions or one of these functions. The frame driving portion 140 may selectively rotate or flip the wide lead frame 70, or return the wide lead frame 70 to the index rail 120, according to the state of the wide lead frame 70.

The loader portion 110 may fill the magazine with the wide lead frame 70 having the semiconductor chips 210 wire bonded thereto and put the magazine away. Also, an unloader portion 170 is separately connected to the frame driving portion 140 to fill the magazine with the wide lead frame 70 having the semiconductor chips 210 wire bonded thereto and put the magazine away. That is, the loader portion 110 may have both of the loading and unloading functions or the unloader portion 170 having the unloading function may be separately used. When the unloader portion 170 is used, the frame driving portion 140 may selectively rotate or flip the wide lead frame 70, return the wide lead frame 70 to the index rail, or transfer the wide lead frame to the unloader portion 170, according to the state of the wide lead frame 70. In other words, whether to include the unloading function in the loader portion 110 or to separately connect the unloader portion 170 can be selectively determined according to a work efficiency such as work movement or convenience in distinguishing the wide lead frame 70 that is wire bonded from the wide lead frame 70 that is not wire bonded.

Figure 5:
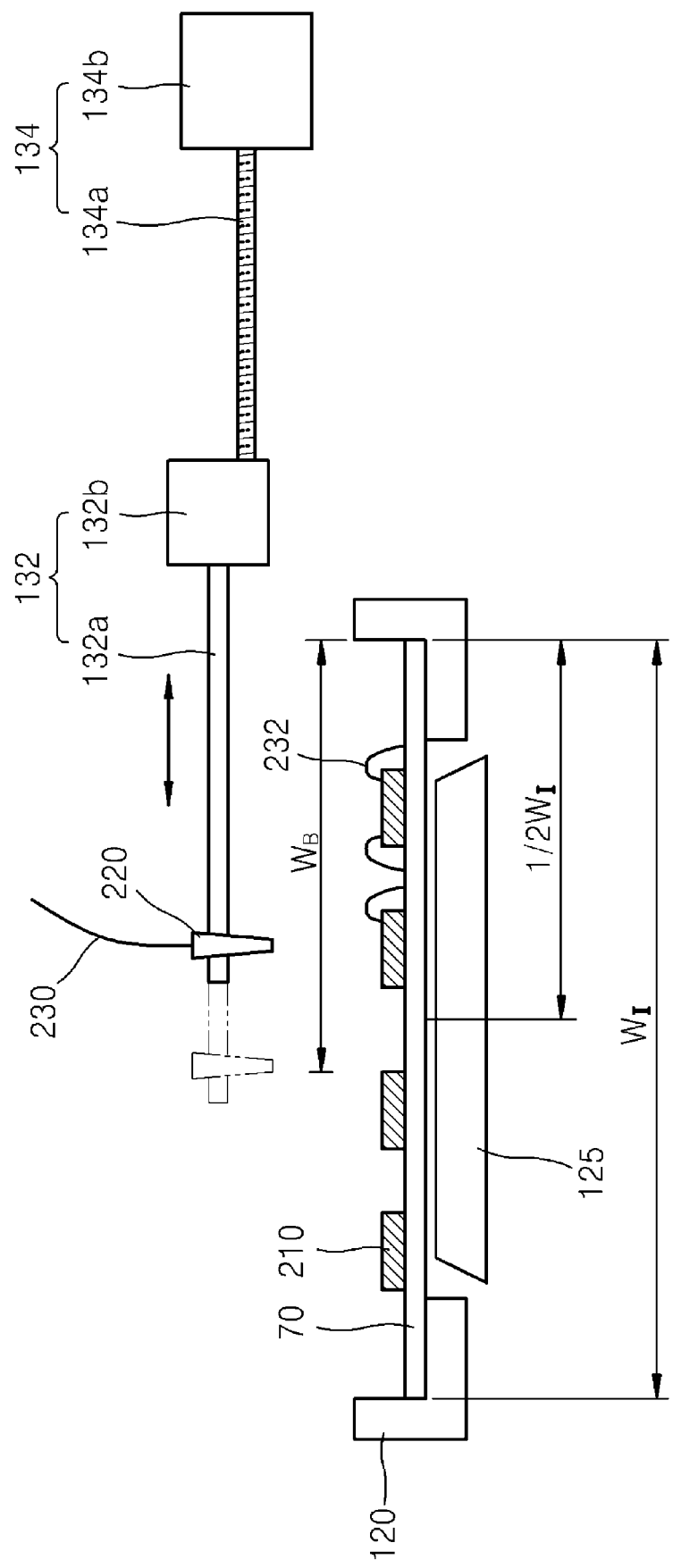

FIG. 5 is a cross-sectional view taken along line V-V of FIG. 4, illustrating an apparatus for manufacturing a semiconductor package according to an embodiment of the present invention. Referring to FIG. 5, the wire bonding portion 130 includes a bonding head 132 and a transfer rail 134. The bonding head 132 includes a bonding transducer 132a and a head block 132b. The bonding transducer 132a is connected to the head block 132b and moves up and down to transfer energy needed for wire bonding, for example, energy using an ultrasonic wave. A bonding probe 220 may be connected to an end tip of the bonding transducer 132. The bonding probe 220 may form a wire bond 232 electrically connecting the semiconductor chip 210 and the wide lead frame 70 using a conductive wire 230, for example, a gold wire. The transfer module 134 includes a transfer shaft 134a and a transfer driving apparatus 134b and can move the bonding head 132 on the wide lead frame 70. The effective movement distance of the bonding head 132 denotes the distance at which the wire bond 232 can be formed as the bonding head 132 moves. The width $W_1$ of the index rail 120 denotes the width of the wide lead frame 70 that can be placed on the index rail 120.

Referring to FIGS. 3 and 5, when the index rail 120 can accommodate the wide lead frame 70 having a variety of widths, the width $W_I$ of the index rail 120 denotes the width of a wide lead frame having the maximum width among any wide lead frames that can be placed on the index rail 120. Thus, the width $W_I$ of the index rail 120 is not less than the width W of the wide lead frame 70 ($W_I \geq W$). However, in the following description, for the convenience of explanation, the wide lead frame 70 denotes a wide lead frame having the maximum width that can be accommodated on the index rail 120. Accordingly, unless stated otherwise, the width $W_I$ of the index rail 120 is the same as the width W of the wide lead frame 70 ($W_I = W$).

The effective movement distance $W_B$ of the bonding head 132 is from an end of the index rail 120 in the widthwise direction $W_I$ to at least the width centerline C of the wide lead frame 70 and does not cover the entire width W of the wide lead frame 70 ($W_I/2 \leq W_B < W_I$). That is, although the transfer module 134 can move the bonding head 132 with the required precision over a half portion of the width $W_I$ of the index rail 120, the bonding head 132 cannot move over the entire width $W_I$ of the index rail 120 with the required precision. Thus, although the wire bonding portion 130 can form the wire bond 232 at least in one half portion of the wide lead frame 70 in the widthwise direction thereof, the wire bonding portion 130 cannot form the wire bond 232 entirely or partially in the other half portion of the width $W_I$ of the index rail 120 that is the opposite to the one half portion.

In other words, although the wire bonding portion 130 can form the wire bond 232 that electrically connects the wide lead frame 70 and all semiconductor chips 210 existing from one portion of the wide lead frame 70 in the widthwise direction to the width centerline C of the wide lead frame 70, it cannot form the wire bond 232 that electrically connects the wide lead frame 70 and all semiconductor chips 210 on the wide lead frame 70. Not being able to form the wire bond 232 signifies that it is not possible to form the wire bond 232 with the precision required by the wide lead frame 70, that is, within a predetermined error range.

When the wire bond 232 electrically connecting the semiconductor chip 210 and the wide lead frame 70 is formed by the wire bonding portion 130, an absorption block 125 supplies pressure or heat from under the wide lead frame 70 to facilitate the attachment of the semiconductor chip 210 to the wide lead frame 70.

Figure 6:
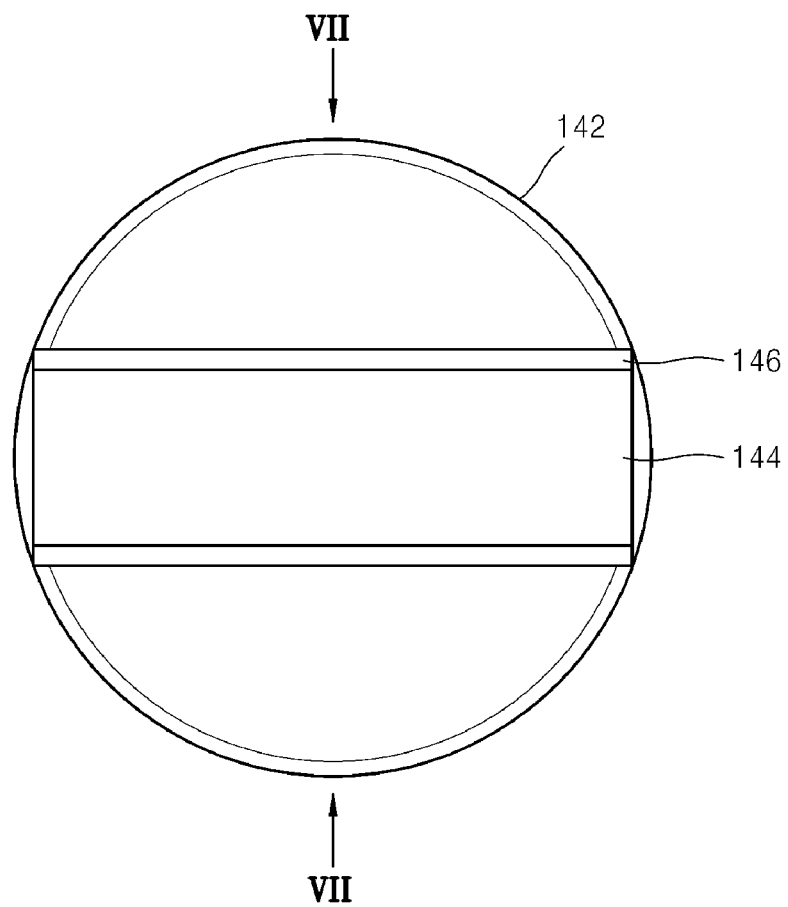
FIGS. 6 and 7 are, respectively, a plan view and a cross-sectional view of a rotary table according to an embodiment of the present invention.

FIG. 6 is a plan view of a rotary table 142 according to an embodiment of the present invention. Referring to FIGS. 4 and 6, the frame driving portion 140 includes the rotary table 142. A frame loading rail 144 supporting the wide lead frame 70 transferred from the index rail 120, one for each time, is coupled to the rotary table 142. A frame fixing apparatus 146 for pressing the wide lead frame 70 to fix it on the frame loading rail 144 may be further coupled to the frame loading rail 144. The wide lead frame 70 placed on the frame loading rail 144 can be rotated together with the rotary table 142.

Figure 7:
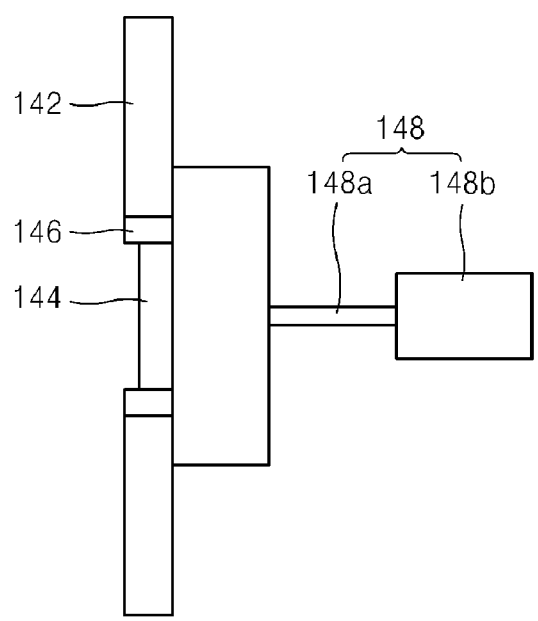

FIG. 7 is a cross-sectional view of the rotary table 142, taken along line VII-VII of FIG. 6. Referring to FIG. 7, a rotation apparatus 148 is connected to the low portion of the rotary table 142. The rotation apparatus 148 includes a rotational shaft 148a and a rotation driving apparatus 148b. The rotational shaft 148a is connected to the rotary table 142 in a direction along a normal to the upper surface of the frame loading rail 144 coupled to the rotary table 142, that is, the upper surface of the wide lead frame 70 placed on the frame loading rail 144. Thus, when the rotation driving apparatus 148b rotates the rotational shaft 148a, the frame loading rail 144 is rotated with the rotary table 142 so that the wide lead frame 70 can be rotated around a normal to the upper surface of the wide lead frame 70. The rotation driving apparatus 148b may provide a rotation driving force to the rotational shaft 148a using an air cylinder (not shown). Accordingly, the rotation apparatus 148 can smoothly rotate the wide lead frame 70 by 180°. However, the rotation apparatus 148 may rotate the wide lead frame 70 at a different angle according to the connection with peripheral devices. The direction of the rotation of the rotational shaft 148a may be selected according to necessity, for example, to the left or right with respect to the rotational shaft 148a.

Figure 8:
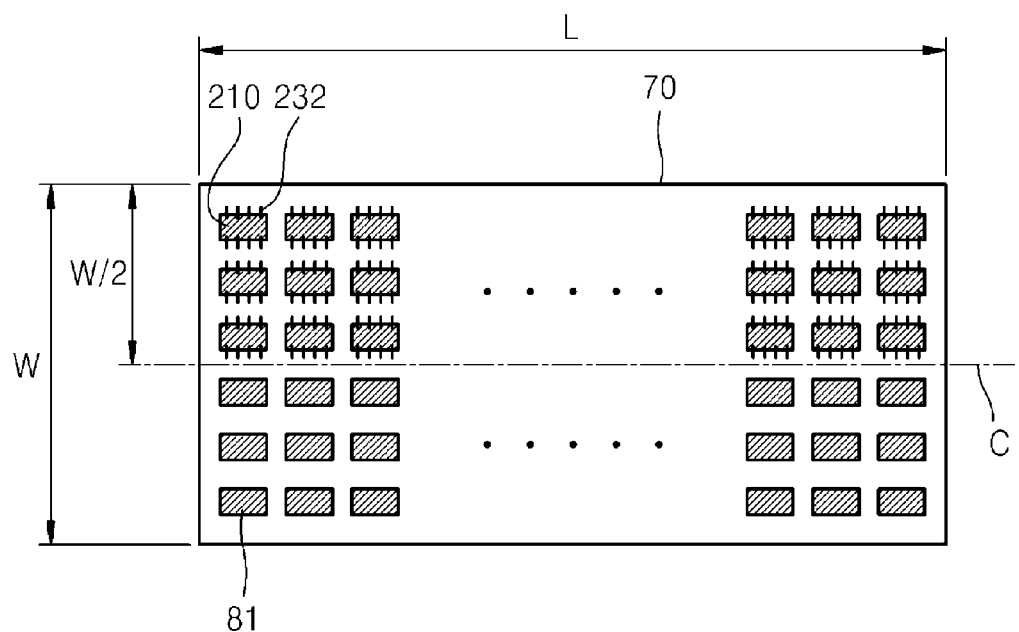
FIGS. 8-11 illustrate a wire bonding process according to an embodiment of the present invention.

FIGS. 8-11 illustrate a wire bonding process according to an embodiment of the present invention. FIG. 8 illustrates a case where the wire bond 232 is formed on a portion of the upper surface of the wide lead frame 70. Referring to FIG. 8, the wire bond 232 electrically connecting the wide lead frame 70 and the semiconductor chips 210 existing in one half portion of the wide lead frame 70 with respect to the width centerline C is formed. The wire bond 232 electrically connecting the wide lead frame 70 and the semiconductor chips 210 existing in the one half portion and some of the semiconductor chips 210 existing in the other half portion of the wide lead frame 70 may be formed. However, all of the semiconductor chips 210 in the other half portion of the wide lead frame 70 may not be electrically connected to the wide lead frame 70 by the wire bond 232. After all of the semiconductor chips 210 in the one half portion of the wide lead frame 70 and the wide lead frame 70 are electrically connected by the wire bond 232, the wide lead frame 70 is transferred to the frame driving portion 140.

In the following description, the expression that "the wire bond 232 is formed in the one half portion of the wide lead frame 70" denotes that all of the semiconductor chips 210 existing at least in the one half portion of the wide lead frame 70 with respect to the width centerline C, and some of the semiconductor chips 210 existing in the other half portion of the wide lead frame 70, but not all of the semiconductor chips 210 existing in the other half portion of the wide lead frame 70, may be electrically connected to the wide lead frame 70 by the wire bond 232.

Figure 9:
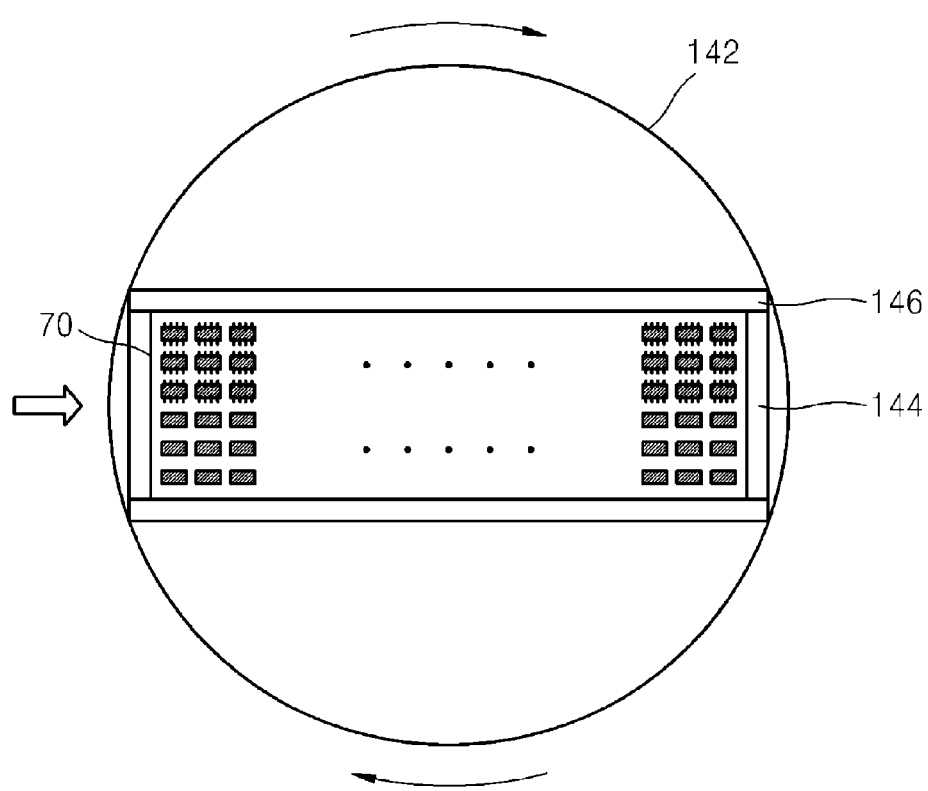

FIG. 9 illustrates a case where the wide lead frame 70 according to an embodiment of the present invention is rotated. Referring to FIG. 9, the wide lead frame 70 is placed on the frame loading rail 144 and may be pressed by the frame fixing apparatus 146 to be fixed on the frame loading rail 144. As the rotary table 142 rotates, the wide lead frame 70 rotates together.

Figure 10:
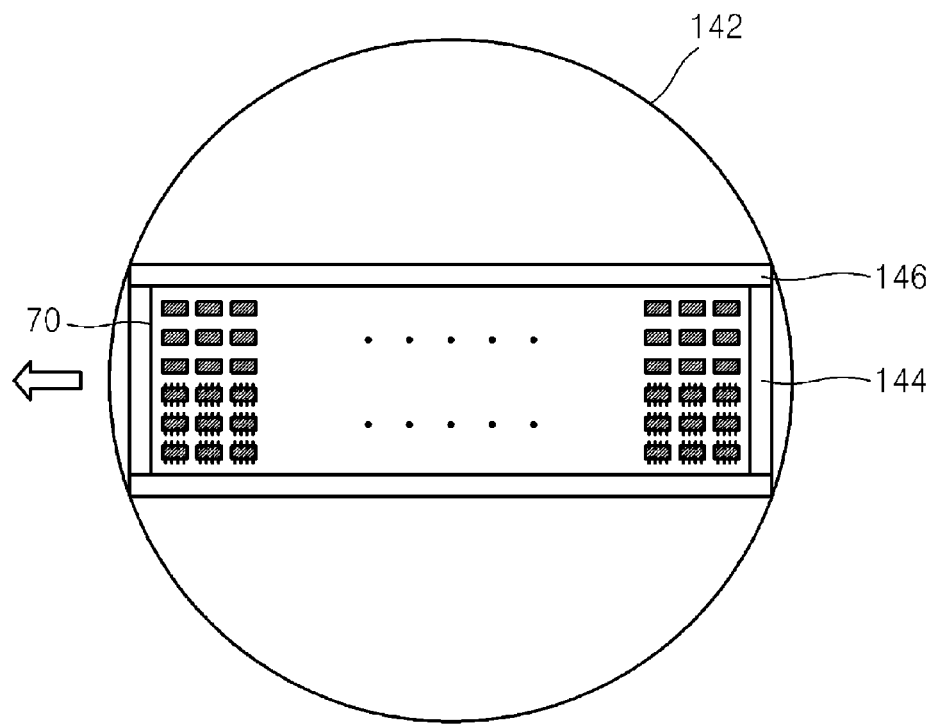

FIG. 10 illustrates a case where the wide lead frame 70 is rotated. Referring to FIG. 10, the wide lead frame 70 is rotated by 180° around a normal to the upper surface of the wide lead frame 70. Accordingly, the wide lead frame 70 is reversed such that the position of the one half portion of the wide lead frame 70 where all of the semiconductor chips 210 are wire bonded and the position of the other half portion of the wide lead frame 70 where the semiconductor chips 210 are partially or not at all wire bonded are switched. Then, the wide lead frame 70 is supplied to the index rail 120.

Figure 11:
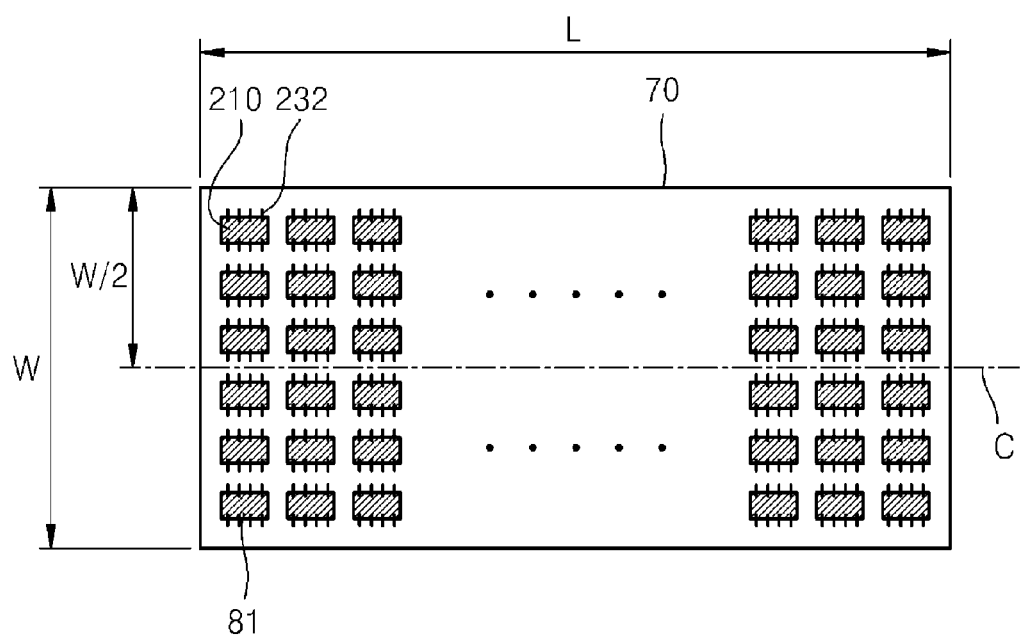

FIG. 11 illustrates a case where the wire bond 232 is formed on the entire upper surface of the wide lead frame 70. Referring to FIG. 11, the wide lead frame 70 is transferred to the wire bonding portion 130 by means of the index rail 120. Since the portions of the wide lead frame 70 in the widthwise direction are switched because the wide lead frame 70 is rotated, the wire bond 232 may be formed in the other half portion of the wide lead frame 70 where the wire bond 232 for electrically connecting the wide lead frame 70 and the semiconductor chip 210 is partially or not at all formed. Thus, the wire bond 232 is formed such that all of the semiconductor chip 210 on the upper surface of the wide lead frame 70 can be electrically connected to the wide lead frame 70.

The wide lead frame 70 that is electrically connected to all of the semiconductor chips 210 by the wire bond 232 is transferred to the loader portion 110 and unloaded, or transferred to the unloader portion 170 via the frame driving portion 140 and unloaded. As a result, the wire bonding process can be performed for a wide lead frame having a relatively large width by using the wire bonding portion 130 that is suitable for a lead frame having a relatively narrow width and is also relatively cheap.

Figure 12:
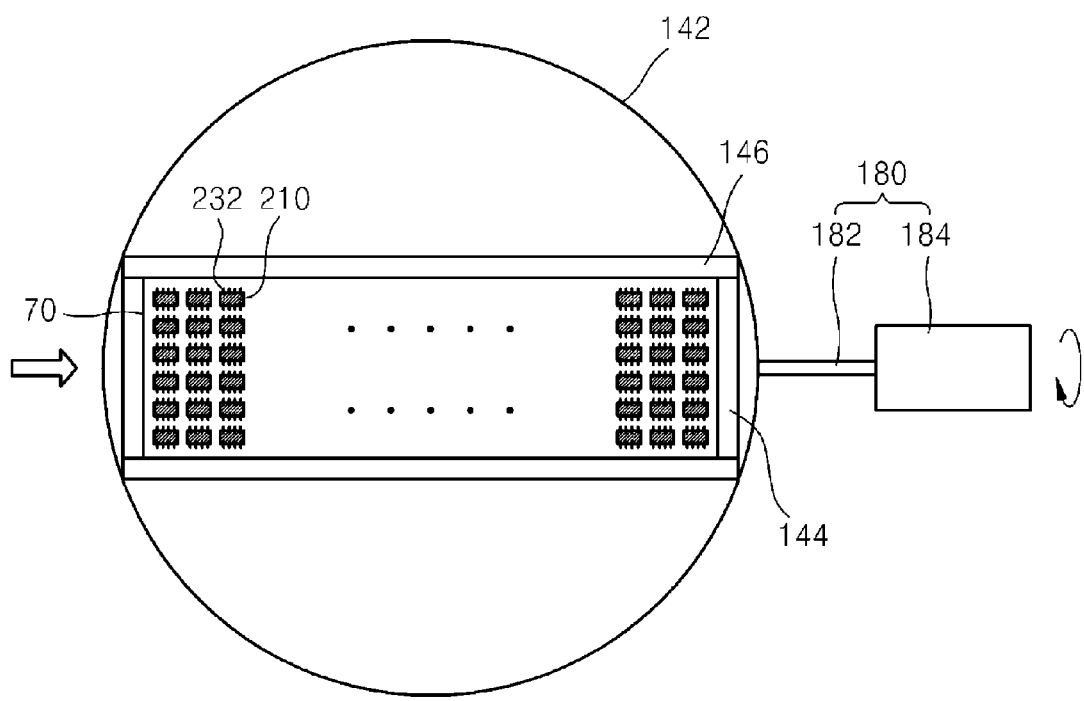
FIGS. 12 and 13 illustrate a wire bonding process according to another embodiment of the present invention.
Figure 13:
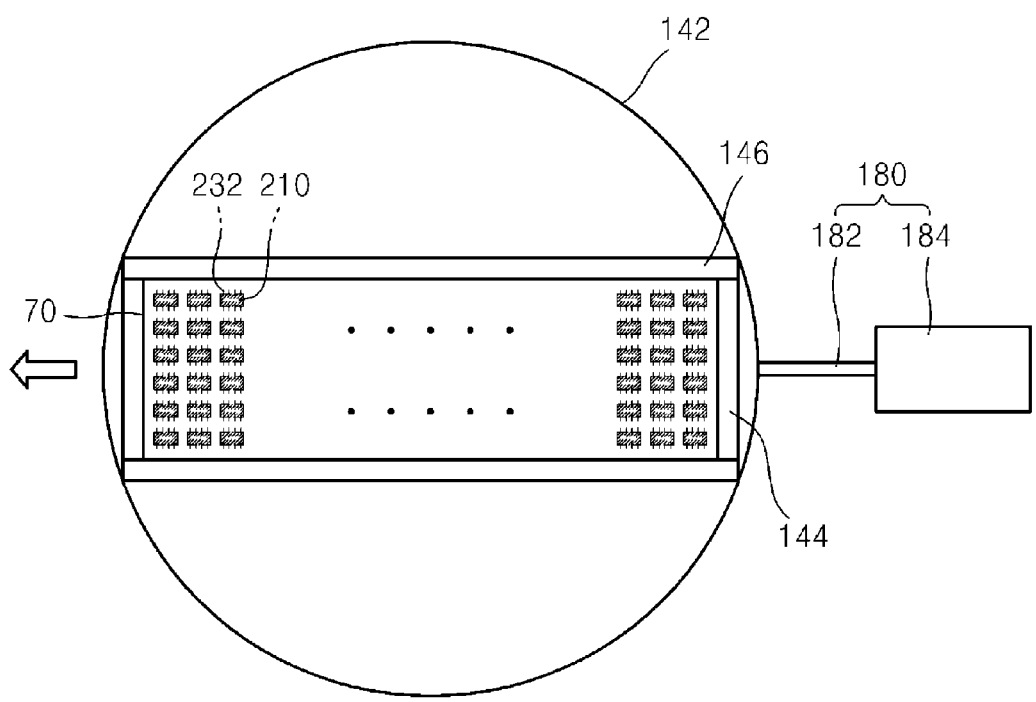

FIGS. 12 and 13 illustrate a wire bonding process according to another embodiment of the present invention. FIG. 12 illustrates a case where the semiconductor chips 210 attached to the upper surface of the wide lead frame 70 and the wide lead frame 70 are electrically connected by the wire bond 232, according to another embodiment of the present invention. Referring to FIG. 12, a reversing apparatus 180 is connected to the frame loading rail 144 coupled to the rotary table 142 in the frame driving portion 140. The rotation apparatus 148 of FIG. 7 may be connected to the rotary table 142. That is, the frame driving portion 140 may include only the rotation apparatus 148, only the reversing apparatus 180, or both of the rotation apparatus 148 and the reversing apparatus 180, as necessary.

The reversing apparatus 180 includes a reversing rotational shaft 182 extending in a lengthwise direction of the wide lead frame 70 placed on the frame loading rail 144 and a reversing driving apparatus 184 connected to the reversing rotational shaft 182. When the reversing rotational shaft 182 is rotated by the reversing driving apparatus 184, the wide lead frame 70 placed on the frame loading rail 144 is reversed such that the upper surface of the wide lead frame 70 faces downward. Accordingly, the wide lead frame 70 is preferably pressed by the frame fixing apparatus 146 so as not to be separated from the frame loading rail 144.

FIG. 13 illustrates a case where the semiconductor chips 210 electrically connected to the wide lead frame 70 by the wire bond 232 are located on the lower surface of the wide lead frame according to another embodiment of the present invention. Referring to FIG. 13, the wide lead frame 70 is reversed by the reversing apparatus 180 such that the upper surface of the wide lead frame 70 faces downward. Accordingly, the wire bond 232 for electrically connecting the wide lead frame 70 and the semiconductor chips 210 are located on the lower surface of the wide lead frame 70. The wide lead frame 70 is supplied to the index rail 120 so that the wire bond 232 is formed on the upper surface of the wide lead frame 70 where the wire bond 232 is not formed, thereby electrically connecting the semiconductor chips 210 and the wide lead frame 70.

Figure 14:
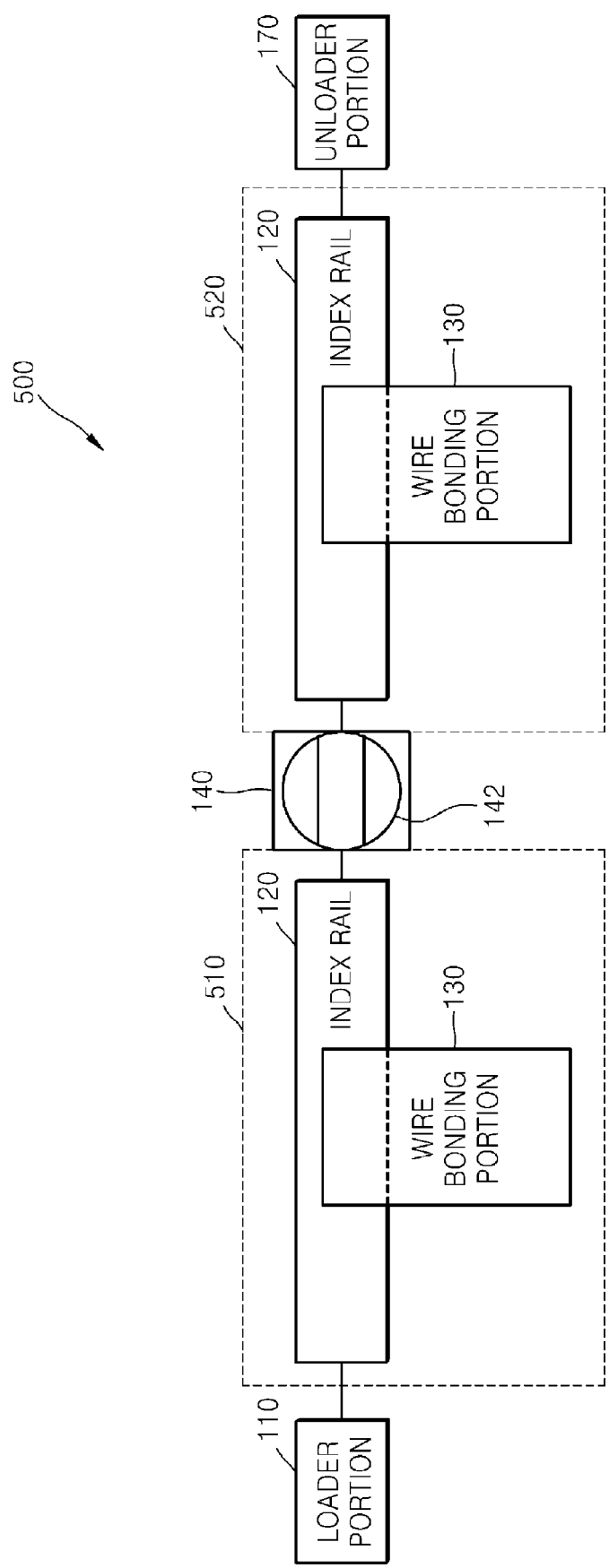
FIG. 14 is a plan view of an apparatus for manufacturing a semiconductor package according to another embodiment of the present invention.

FIG. 14 is a plan view of an apparatus for manufacturing a semiconductor package according to another embodiment of the present invention. Referring to FIG. 14, a semiconductor package manufacturing apparatus 500 includes the loader portion 110, a first wire bonding apparatus 510, the frame driving portion 140, and a second wire bonding apparatus 520. The semiconductor package manufacturing apparatus 500 may further include the unloader portion 170. Each of the first and second wire bonding apparatuses 510 and 520 includes the index rail 120 and the wire bonding portion 130. Since the loader portion 110, the index rail 120, the wire bonding portion 130, the frame driving portion 140, the wafer table 150, the wafer cassette loader portion 160, and the unloader portion 170 are the same as those of FIGS. 4-13, detailed descriptions thereof will be omitted herein. Also, the first and second wire bonding apparatuses 510 and 520 have the same structure.

In the semiconductor package manufacturing apparatus 500, the loader portion 100 supplies the wide lead frame 70 to the first wire bonding apparatus 510. The first wire bonding apparatus 510 forms the wire bond 232 in one half portion of the upper surface of the wide lead frame 70. Then, the wide lead frame 70 is rotated around a normal to the upper surface of the wide lead frame 70 in the frame driving portion 140 and supplied to the second wire bonding apparatus 520. The second wire bonding apparatus 520 forms the wire bond 232 between the wide lead frame 70 and all of the semiconductor chips 210 that is not electrically connected to the wide lead frame 70 because the wire bond 232 is not formed, on the upper surface of the wide lead frame 70. The wide lead frame 70 on which the wire bond 232 is formed for all of the semiconductor chips 210 is exhausted via the unloader portion 170.

Alternatively, a semiconductor package manufacturing apparatus can be configured by serially connecting a plurality of wire bonding apparatuses, each including the index rail 120 and the wire bonding portion 130, thereby performing the wire bonding process.

Also, although it is not illustrated in the drawings, a wire bonding apparatus including the index rail 120 and the wire bonding portion 130, the loader portion 110, the frame driving portion 140, and the unloader portion 170 are combined as necessary to configure various types of semiconductor package manufacturing apparatuses. For example, a semiconductor package manufacturing apparatus can be configured by sequentially combining the loader portion 110 having an unloading function, the first wire bonding apparatus 510, the frame driving portion 140 having a rotation function, the second wire bonding apparatus 520, and the frame driving portion 140 having a reversing function. In this case, the loader portion 110 supplies the wide lead frame 70. The wire bond 232 is formed in one half portion of a first surface of the wide lead frame 70 by the first wire bonding apparatus 510. The wire bond 232 is formed in the other half portion of the first surface by the second wire bonding apparatus 520. Then, the wide lead frame 70 is reversed by the frame driving portion 140 having a reversing function so that the first surface faces downward. The wire bond 232 is formed in one half portion of a second surface of the wide lead frame 70 by the second wire bonding apparatus 520. The wide lead frame 70 is rotated by the frame driving portion 140 having a rotation function. The wire bond 232 is formed in the other half portion of the second surface by the first wire bonding apparatus 510. Then, the wide lead frame 70 is unloaded by the loader portion 110 having an unloading function. Thus, the wire bond 232 can be formed entirely on both surfaces of the wide lead frame 70.

In another example, a loader portion having an unloading function, a first wire bonding apparatus, a first frame driving portion having a rotation function, a second wire bonding apparatus, a second frame driving portion having a reversing function, a third wire bonding apparatus, a third frame driving portion having a rotation function, a fourth wire bonding apparatus, and an unloader portion are sequentially connected so that the wire bond 232 can be formed entirely on both surfaces of the wide lead frame 70.

Although in the above description the semiconductor chips are electrically connected to the wide lead frame by wire bonding a layer of the semiconductor chips attached to the wide lead frame, the present invention is not limited thereto. For example, the present invention can be applied to a multi-chip packaging technique for attaching a plurality of semiconductor chips in layers on a wide lead frame. That is, the present invention can be applied to a case in which a plurality of semiconductor chips forming a single layer and the wide lead frame are electrically connected to each other by forming a wire bond and then other semiconductor chips are attached to the layer to form another layer.

According to the apparatus and method of manufacturing a semiconductor package according to the present invention, a wire bonding process can be performed to a wide lead frame at a relatively low cost while maintaining high precision. Thus, the cost of raw materials can be saved and productivity can be improved. Also, during the wire bonding of the wide lead frame, since the wide lead frame does not need to be manually reversed by an operator, work time can be shortened and a defect rate can be reduced.

Furthermore, since the configuration of an apparatus can be freely modified according to the type of a desired semiconductor package, for example, multi-chip packaging or double-sided packaging, the apparatus can be efficiently used in spite of the change of a product or a packaging technique and it is possible to quickly response to the change in market.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An apparatus for manufacturing a semiconductor package, the apparatus comprising:
    an index rail for transferring a wide lead frame including a plurality of unit lead frames arranged in both lengthwise and widthwise directions in forward and backward directions, the wide lead frame having a first surface and a second surface that is opposite to the first surface;
    a loader portion connected to an end portion of the index rail to supply the wide lead frame to the index rail;
    a lead frame driving portion connected to an opposite end portion opposite to the end portion of the index rail, supporting one surface of the first and second surfaces, to rotate the wide lead frame around a normal to the first surface, and to flip the wide lead frame so that one surface facing upward from the first and second surfaces of the wide lead frame faces downward; and
    a wire bonding portion electrically connecting the wide lead frame and a semiconductor chip attached to the lead frame supplied to the index rail using a wire bond.

2. The apparatus of claim 1, wherein the wire bonding portion comprises:
    a bonding head having a bonding transducer connecting the wide lead frame and the semiconductor chip attached to the wide lead frame using a conductive wire; and
    a transfer module transferring the bonding head over the index rail.

3. The apparatus of claim 2, wherein the transfer module moves the bonding head in a widthwise direction of the index rail from one end of the index rail in the widthwise direction at least to a center position of a width of the index rail.

4. The apparatus of claim 1, further comprising an unloading portion connected to the lead frame driving portion to exhaust the lead frame to an outside of the apparatus, wherein the lead frame driving portion selectively transfers the wide lead frame to the unloading portion or supplies the lead frame back to the index rail according to the state of the wide lead frame.

5. The apparatus of claim 1, wherein, to rotate the wide lead frame around a normal to the first surface, the lead frame driving portion comprises:
    a lead frame loading rail supporting the wide lead frame;
    a rotary table supporting the lead frame loading rail;
    a rotational shaft connected to the rotary table in a direction along the normal to the first surface, wherein the rotary table is rotated by the rotational shaft around the normal to the first face; and
    a rotation driving apparatus supplying a rotation driving force to the rotation shaft.

6. The apparatus of claim 5, wherein the lead frame loading rail supports the lead frame so that the lead frame driving portion rotates the wide lead frame one for each time.

7. The apparatus of claim 1, wherein the lead frame driving portion rotate the wide lead frame by 180°.

8. The apparatus of claim 1, wherein the loader portion has an unloading function to exhaust the wide lead frame transferred from the index rail to the outside of the apparatus.

9. The apparatus of claim 1, wherein the lead frame driving portion further comprises a reversing apparatus including a reversing rotational shaft extending in the lengthwise direction of the wide lead frame and a reversing driving apparatus to rotate the reversing rotational shaft, the reversing apparatus reversing the wide lead frame so that one surface facing upward from the first and second surfaces of the wide lead frame faces downward.

10. An apparatus for manufacturing a semiconductor package, the apparatus comprising:
    a first wire bonding apparatus and a second wire bonding apparatus, each comprising an index rail transferring a wide lead frame having a first surface and a second surface that is opposite to the first surface in forward and backward directions and a wire bonding portion electrically connecting the lead frame and a semiconductor chip attached to the lead frame, using a wire bond, the wide lead frame including a plurality of unit lead frames arranged in both of a lengthwise direction and a widthwise direction;
    a loader portion connected to an end portion of the first wire bonding apparatus to supply the wide lead frame to the first wire bonding apparatus;
    an unloader portion connected to an end portion of the second wire bonding apparatus to exhaust the lead frame from the second wire bonding apparatus; and
    a lead frame driving portion connected between an opposite end portions opposite to the end portions of the first and second wire bonding apparatuses, to flip the wide lead frame so that one surface facing upward from the first and second surfaces of the wide lead frame faces downward, and to rotate the wide lead frame around a normal to the first surface.

11. The apparatus of claim 10, wherein the wire bonding portion comprises:

a bonding head connecting the wide lead frame and the semiconductor chip attached to the wide lead frame using a gold wire; and a transfer module transferring the bonding head over the index rail.

12. The apparatus of claim 11, wherein the bonding head moves along the transfer rail in a widthwise direction of the index rail from one end of the index rail in the widthwise direction at least to a center position of a width of the index rail.

13. The apparatus of claim 10, wherein the lead frame driving portion selectively transfers the wide lead frame to the first wire bonding apparatus or the second wire bonding apparatus according to the state of the wide lead frame.

14. The apparatus of claim 13, wherein the lead frame driving portion further comprises a reversing apparatus including a reversing rotational shaft extending in the lengthwise direction of the wide lead frame and a reversing driving apparatus to rotate the reversing rotational shaft, the reversing apparatus reversing the wide lead frame so that one surface facing upward from the first and second surfaces of the wide lead frame faces downward.

15. An apparatus for manufacturing a semiconductor package, the apparatus comprising:

an index rail for transferring a wide lead frame including a plurality of unit lead frames arranged in both of lengthwise and widthwise directions in forward and backward directions, the wide lead frame having a first surface and a second surface that is opposite to the first surface;

a loader portion connected to an end portion of the index rail to supply the wide lead frame to the index rail;

a lead frame driving portion connected to an opposite end portion opposite to the end portion of the index rail, supporting one surface of the first and second surfaces, to rotate the wide lead frame around a normal to the first surface by 180° so that a position of one half portion and the other portion of the wide lead frame with respect to a center of the widthwise direction is switched, and to flip the wide lead frame so that one surface facing upward from the first and second surfaces of the wide lead frame faces downward; and a wire bonding portion electrically connecting the wide lead frame and a semiconductor chip attached to the lead frame supplied to the index rail using a wire bond.

* * * * *

UNITED STATES PATENT AND TRADEMARK OFFICE
CERTIFICATE OF CORRECTION

| | | |
|---|---|---|
| PATENT NO. | : 7,934,632 B2 | |
| APPLICATION NO. | : 12/393651 | |
| DATED | : May 3, 2011 | |
| INVENTOR(S) | : Hwang | |

It is certified that error appears in the above-identified patent and that said Letters Patent is hereby corrected as shown below:

In claim 7, column 12, line 29, please replace "rotate" with --rotates--.

Signed and Sealed this
Twenty-eighth Day of June, 2011

David J. Kappos
*Director of the United States Patent and Trademark Office*